(12) United States Patent
Niitsu (10) Patent No.: US 8,157,598 B2
(45) Date of Patent: Apr. 17, 2012

(54) INPUT/OUTPUT CONNECTOR WITH CAPACITIVE COUPLING MATING INTERFACE

(75) Inventor: Toshihiro Niitsu, Tokyo (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/997,311

(22) PCT Filed: Apr. 28, 2009

(86) PCT No.: PCT/US2009/041917
§ 371 (c)(1),
(2), (4) Date: Feb. 25, 2011

(87) PCT Pub. No.: WO2009/151804
PCT Pub. Date: Dec. 17, 2009

(65) Prior Publication Data
US 2011/0143602 A1 Jun. 16, 2011

Related U.S. Application Data

(60) Provisional application No. 61/131,525, filed on Jun. 10, 2008.

(51) Int. Cl.
*H01R 24/00* (2011.01)
(52) U.S. Cl. .................................. 439/660; 439/620.22
(58) Field of Classification Search .................. 439/660, 439/637, 620.16, 65, 607.01, 67, 658, 377, 439/499, 495, 620.09, 620.22
See application file for complete search history.

(56) References Cited

U.S. PATENT DOCUMENTS

| 5,574,273 | A | 11/1996 | Nakagawa et al. |
| 5,593,314 | A * | 1/1997 | Lincoln .......................... 439/418 |
| 6,409,545 | B1 * | 6/2002 | Vetter et al. .............. 439/620.24 |
| 2005/0176301 | A1 | 8/2005 | Barr |
| 2005/0206603 | A1 | 9/2005 | Kawachi et al. |
| 2006/0009080 | A1 | 1/2006 | Regnier et al. |
| 2010/0317230 | A1 * | 12/2010 | Larsen et al. ............ 439/620.22 |

FOREIGN PATENT DOCUMENTS

| EP | 0 175 868 A2 | 4/1986 |
| EP | 0 649 193 A1 | 4/1995 |
| EP | 1 876 675 A1 | 1/2008 |
| WO | WO 2005/015583 A1 | 2/2005 |

OTHER PUBLICATIONS

International Search Report for PCT/US2009/041917.

* cited by examiner

*Primary Examiner* — Edwin A. Leon
(74) *Attorney, Agent, or Firm* — Timothy M. Morella (57) ABSTRACT

A plug connector (100) has an insulative housing (103) with an. elongated mating blade (104) that supports a plurality of conductors (130) in the form of conductive surfaces disposed on a mating face of the mating blade. Dielectric barriers (150) are disposed on the conductive surfaces so that galvanic connection with contacts on a circuit board is prevented. The dielectric barriers permit transfer of electrical signals from the plug connector conductors to the circuit board contacts. The plug connector fits into a shell member (200) mounted to the circuit board (153) and the shell member includes a plurality of cantilevered press arms (220) that apply a contact pressure on the plug connector to ensure contact between the dielectric barriers and the circuit board contacts.

18 Claims, 13 Drawing Sheets

INPUT/OUTPUT CONNECTOR WITH CAPACITIVE COUPLING MATING INTERFACE

BACKGROUND OF THE INVENTION

The Present Invention is generally directed to input-output ("I/O") connectors, and more particularly to I/O connectors that utilize capacitive-coupling conductor structures to obtain a significant reduced overall height.

I/O connectors are used in many electronic applications. One such application is in mobile telephones. The industry seeks to reduce the overall size of these telephones and I/O connectors can be a barrier to reductions in height as I/O connectors, in many applications, typically require two rows of terminals, one above the other. These multiple rows increase the height of the connector and the manner in which the end or tail portions of the terminals must be arranged, increases the overall size of the connector, which makes their usage in mobile telephones impractical in view of the desire in the mobile telephone industry toward reduced size.

Accordingly, the Present Invention is directed to an improved I/O connector that overcomes the aforementioned disadvantages and presents reduced height, size and cost opportunities.

SUMMARY OF THE INVENTION

It is a general object of the Present Invention to provide an improved I/O connector of reduced height and size which utilizes capacitive coupling to effect signal transmission between the connector and contacts of a circuit board.

Another object of the Present Invention is to provide a plug-style I/O connector wherein the plug connector has an insulative housing with a mating blade extending therefrom, the mating blade supporting a plurality of conductive contacts, the contacts including a dielectric layer, or film applied thereto so as to permit the mating blade to be positioned such that the contacts and dielectric film on the mating blade are positioned in opposition to a like arrangement of contacts arranged on a circuit board, the dielectric layer providing a barrier to galvanic contact between the contacts of the circuit board and the connector.

Yet another object of the Present Invention is to provide an I/O connector that utilizes capacitive coupling arrangement for signal transmission, the connector including a housing for supporting a plurality of wires thereon, a mating blade for contacting with an opposing set of contacts disposed on a circuit board, the mating blade including a plurality of conductive surfaces spaced apart from each other, the conductive surfaces having generally planar surfaces extending along the mating blade, a dielectric film or coating disposed on the exterior of the conductive surfaces, the mating blade further including at least one reaction surface disposed thereon in opposition to the conductive surfaces thereof for providing a dielectric transmission media interposed between the contacts of the I/O connector and the contact of the circuit board, the connector having a reduced height compared to other I/O connectors.

It is still another object of the Present Invention to provide an I/O connector of the plug style as described immediately hereinabove, along with a guide member in the form of a hollow shell that is mountable to the circuit board, the shell including a plurality of walls that cooperatively define a hollow interior receptacle, the receptacle having an opening disposed in a bottom wall thereof so that when the receptacle is properly oriented on a circuit board, a plurality of conductive contact pads arranged on the circuit board are exposed within the receptacle, so that the I/O connector combined conductive surfaces and dielectric film may be slid thereover and in opposition therewith, the shell further including means for applying a force to the I/O connector mating blade pushing the blade in opposition to the circuit board contacts.

In yet a further object of the Present Invention is to provide the shell with at least one press member for exerting a force, preferably a downward force, upon the I/O connector mating blade, the shell further including one or more engagement members that serve to orient the plug connector in alignment with the circuit board for mating with the contact pads disposed on the circuit board.

It is a still further object of the Present Invention to provide a pair of press members, in the form of cantilevered arms integrally formed with the shell, the press arms being formed in a top wall of the shell by U-shaped openings stamped in the shell and the press arms being bent downwardly into the interior receptacle of the shell, the arms frictionally engaging an opposing upper surface of the I/O connector body, and the arms exerting a downward force on the plug connector so that the dielectric film applied to the plug connector contacts is placed into contact with the contacts on the circuit board.

The Present Invention accomplishes the above and other objects by way of its unique structure. In accordance with a first embodiment of the Present Invention, an improved I/O connector is provided in the form of a plug connector with an insulative connector housing, or body portion. This housing has two opposing surfaces and one of the two surfaces is used as a mating portion of the connector and the other of the two surfaces is used as a terminating portion of the connector. Typically, the connectors of the Present Invention will be used to connect a plurality of wires, to traces on a circuit board. In this regard, the connector housing terminating face may be provided with a plurality of individual supports, taking the form of slots in the first embodiment for receiving exposed conductors of the wires which are attached to conductors of the connector housing by way of soldering or the like.

The mating surface of the plug connector has a plurality of conductors disposed thereon and preferably these conductors take the form of planar portions or members that extend lengthwise along the mating surface and which are spaced apart from each other widthwise of the connector housing. The conductors may be conventional metal terminals, or they may include coated surfaces of the connector housing, such as a conductive plating, a conductive plastic or a sputtered metal application as well as other means. These conductors are connected to the wires by way of interposed conductive paths.

Importantly, the conductors are planar and preferably smooth in their lengthwise extent along the connector housing mating face. In order to utilize the conductors in a capacitive coupling, a dielectric is applied to the exposed surfaces of the conductors, that is, to the surfaces that are in opposition to the conductive surfaces on the circuit board when the plug connector is mated to its receptacle shell. This dielectric may be a discrete member and if so, it is preferably provided in the form of a thin film, or layer, applied directly to the conductive surfaces of the conductors. Alternatively, the dielectric may be provided as a coating on the conductive surfaces, and sputtering is one type of application that has been found to give good results.

An exterior shell is also provided as part of the connector assembly and this shell serves the purpose of pressing down on the connector to force it into contact with the surface of the circuit board. In order to effect proper capacitive coupling, it is desirable to have the two conductors (connector and circuit board) the same size and to avoid the presence of any air gaps between the dielectric member and the conductors. This is accomplished by integrating a pressing means with the shell. The shell has a top wall which opposes the top surface of the plug connector when the plug connector is inserted into the shell. One or more pressure members is formed as part of the shell and in the preferred embodiment, these pressure members may take the form of arms that are bent downwardly into the receptacle at an angle so that they will interferingly contact the top surface of the plug connector. These pressure members exert a required downward force on the plug connector and generate enough downward pressure to substantially eliminate any significant air gaps between the dielectric members and the contacts on the circuit board which oppose them. Preferable, the pressure members include a pair of arms that are cut into the top wall of the shell and which are spaced apart widthwise of the shell so that they contact the plug connector housing above at least two of the conductive surfaces thereof.

The press arms of the shell serve to press the plug connector down into contact with the circuit board contact pads and the shell may further include one or more engagement members formed therewith that provide a means for locating, or orienting, the plug connector within the shell and in alignment with the circuit board contacts. These means may include a pair of inturned edges, or retention tabs, that are disposed near the rear of the front edge of the shell. The plug connector has corresponding notches formed along its side that receive these retention tabs so that the conductors of the plug connector are oriented and aligned with the contact pads on the circuit board, and the plug connector is held in place within the shell.

In another embodiment of the Present Invention, the shell includes a bottom wall that extends between its two side walls and the bottom wall further includes one or more contacts formed in or disposed on the bottom wall. The bottom wall is formed of a non-conductive, material so that the contacts formed thereon may be easily isolated from each other by distance. The contacts may be formed as planar coatings on the bottom surface of the bottom wall of the shell member. The shell member bottom wall may be formed of the dielectric material and thus the bottom wall of the shell member is used in this embodiment as the dielectric barrier. Alternatively, the contacts may also be formed separately in the shell member bottom wall with insulative portions separating them widthwise so that the dielectric barrier can remain upon the plug conductor contact surfaces. The contacts, in this alternate embodiment, are preferably raised to a level above the bottom wall so as to better facilitate direct contact with them by the dielectric members of the plug connector. The contacts preferably extend through the body of the shell so that they may be directly attached to the circuit board, if desired.

These and other objects, features and advantages of the Present Invention will be clearly understood through a consideration of the following detailed description.

BRIEF DESCRIPTION OF THE FIGURES

The organization and manner of the structure and operation of the Present Invention, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Invention may be susceptible to embodiment in different forms, there is shown in the Figures, and will be described herein in detail, specific embodiments, with the understanding that the disclosure is to be considered an exemplification of the principles of the Present Invention, and is not intended to limit the Present Invention to that as illustrated.

Figure 1:
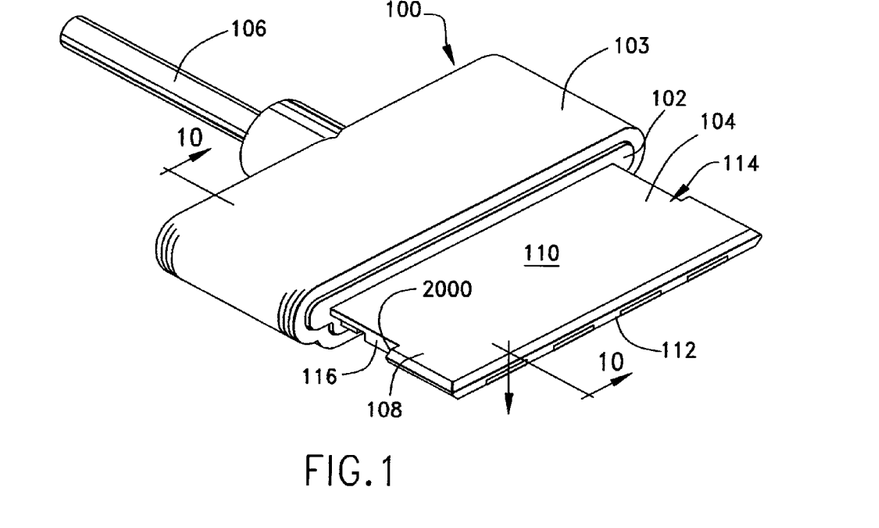
FIG. 1 is a perspective view of an input-output (I/O) connector constructed in accordance with the principles of the Present Invention.

The Present Invention relates to an I/O connector that utilizes a capacitively-coupled mating interface. FIG. 1 illustrates a plug connector 100 constructed in accordance with the principles of the Present Invention. The plug connector 100 includes an insulative housing 102 that is held within an exterior shell 103. The shell may be either conductive so as to provide a measure of electromagnetic shielding to the conductors (not shown) of the plug connector, or it may be insulative. In either instance, the exterior shell 103 provides a protective cover for the plug connector housing 102. The shell 103 has a rear opening formed therein that provides a pathway for electrical wires (not shown) to enter and exit from the connector housing 102, within a protective cable 106. The plug connector 100 is used to make electrical contact between a plurality of wires disposed within a cable and a series of contacts, preferably in the form of contact pads 152 that are disposed on an opposing surface of a printed circuit board 153.

Figure 2:
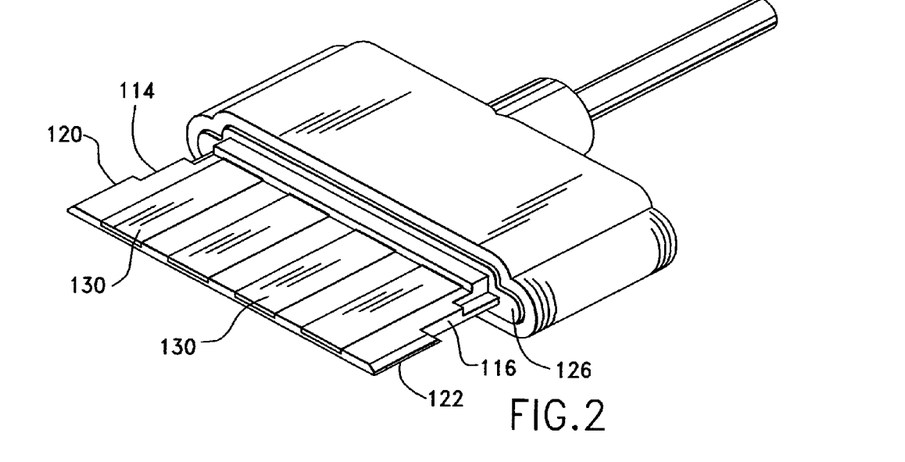
FIG. 2 is the same view as FIG. 1, but showing the underside thereof, and particularly illustrating the connector's capacitive coupling contacts.

The connector housing 102 includes a mating portion 104 that extends forwardly of the connector housing 102 and which takes the form of an elongated mating blade 108 in the drawings. This mating blade 108 has a top, or pressure, surface 110, a bottom, or contact surface 112 and two opposing sides 114,116. As shown best in FIG. 2, the mating blade 108 may have a pair of wing members 120,122 which extend out from the side surfaces 114,116 and in doing so, define a pair of notches 123,125 defined lengthwise between the wing members 120,122 and the front edge 126 of the connector housing 102 and the purpose of these wing members 123,125 will be explained in greater detail to follow.

Figure 3:
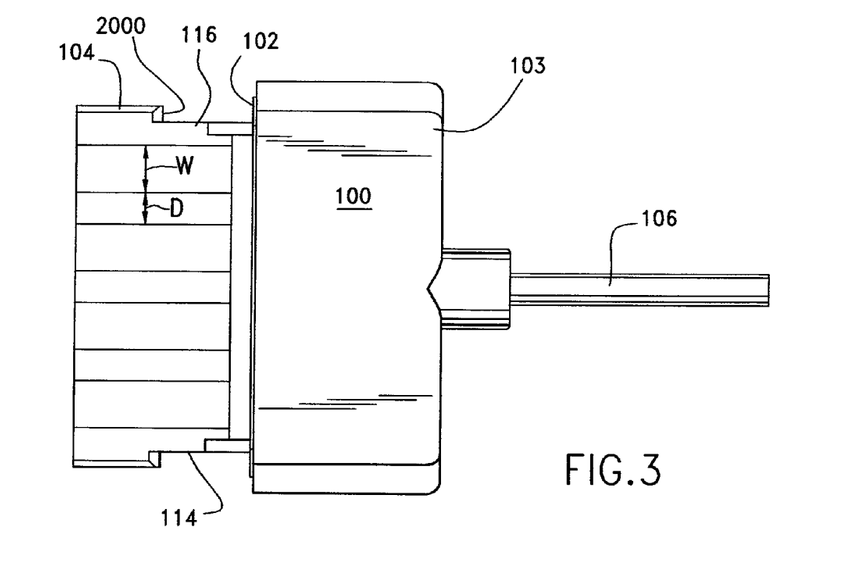
FIG. 3 is a bottom plan view of the I/O connector of FIG. 1.
Figure 4:
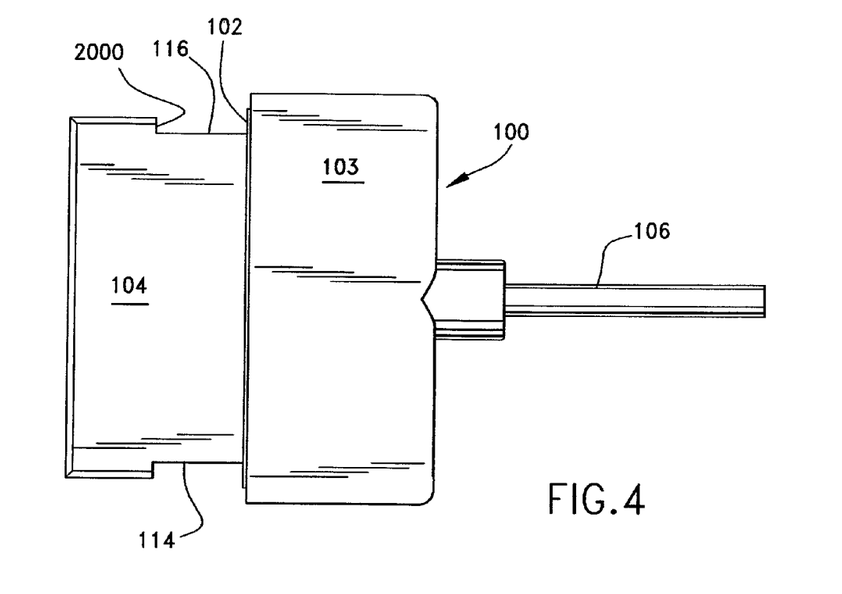
FIG. 4 is a to plan view of the I/O connector of FIG. 1.
Figure 5:
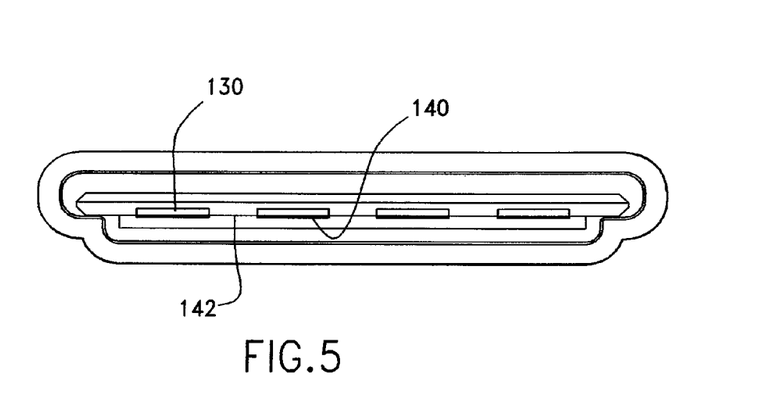
FIG. 5 is a front elevational view of the I/O connector of FIG. 1.
Figure 6:
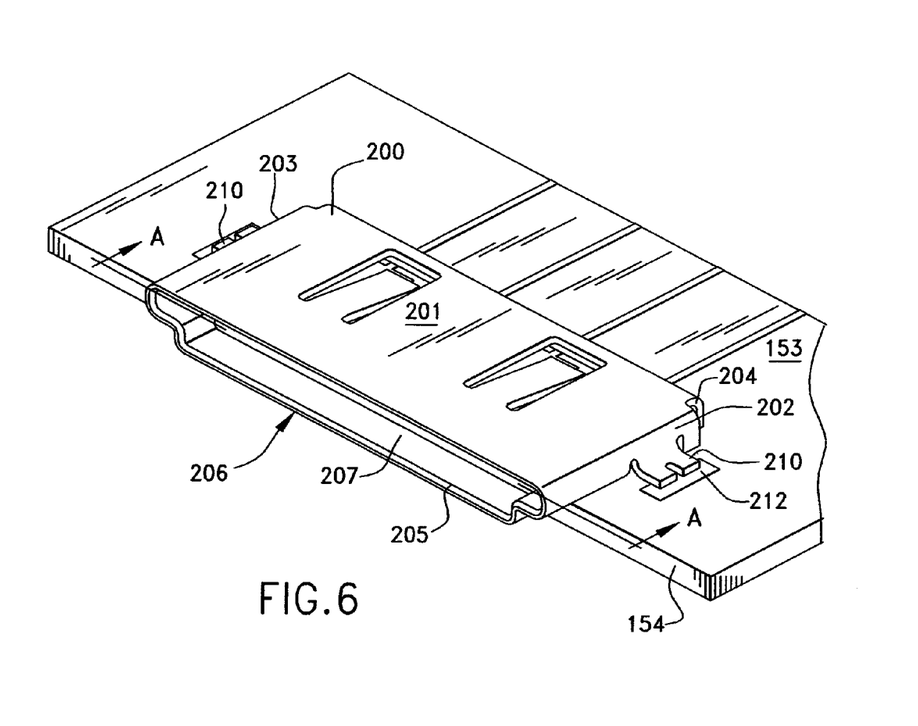
FIG. 6 is a perspective view of a guide, or shell, mounted to a printed circuit board and used in combination with the I/O connector of FIG. 1, which directs the contacts of the I/O connector into opposition with contacts on the circuit board.
Figure 7A:
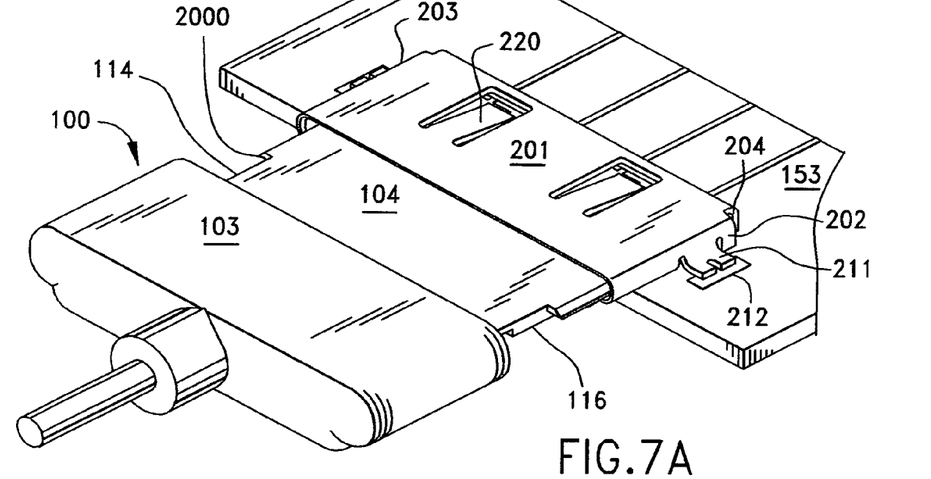
FIG. 7A is the same view as FIG. 6, but with the I/O connector of FIG. 1 partly engaged therewith.
Figure 7B:
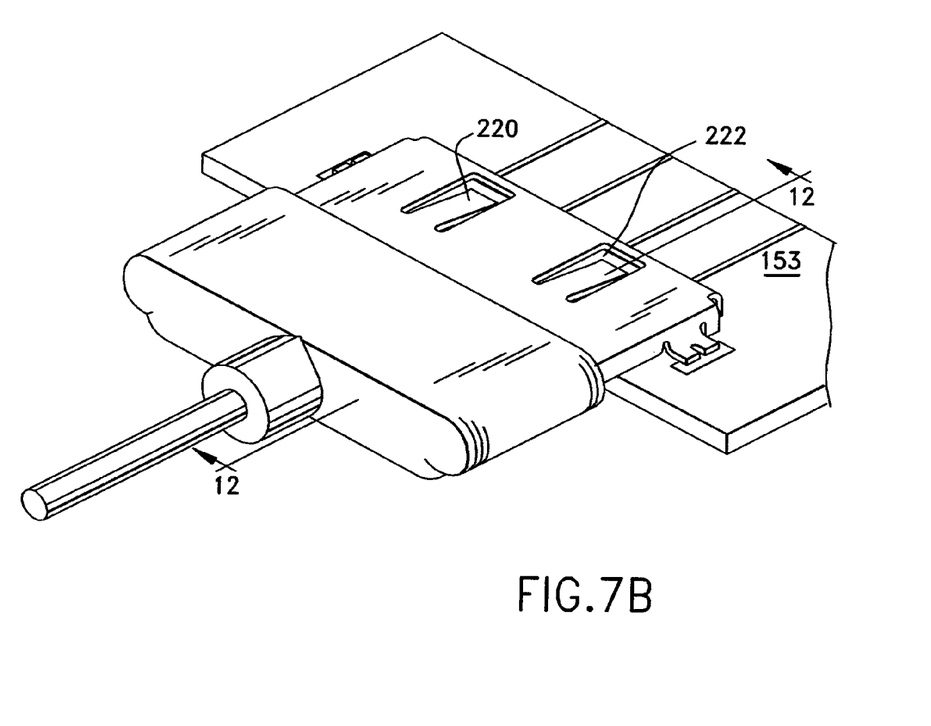
FIG. 7B is the same view as FIG. 7A, but with the I/O connector fully engaged with the outer shell.
Figure 8:
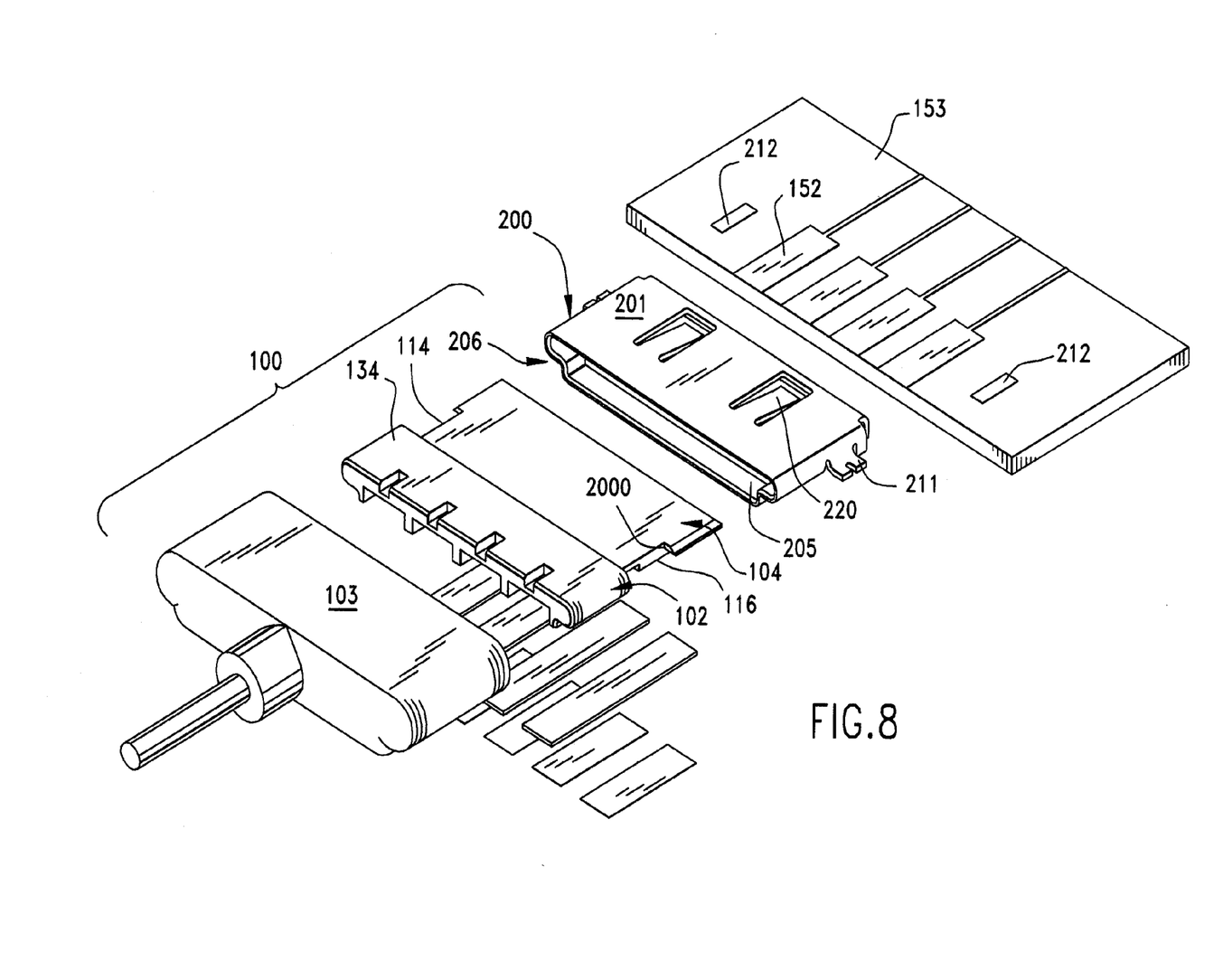
FIG. 8 is an exploded view of the I/O connector and guide of FIG. 7.

The connector housing 102 includes a plurality of conductors 130 that extend lengthwise along the housing 102. The conductors 130 are spaced apart from each other, widthwise of the housing 102 and each conductor 130 has a width W and the conductor 130 are separated from each other by an intervening spacing D. The width and spacing may be the same, or it may differ as shown in FIG. 3.

The mating blade 104 may be formed of the same material as the connector housing 102, namely, an insulative resin or the like and the conductors 130 may be formed in a variety of ways. Firstly, the conductors 130 may include conventional conductive metal contacts formed as terminals, and secondly the conductors 130 may be formed in place on the connector housing 102 and mating blade 108 by application of a conductive plating thereof, or by molding the connector housing 102 in a two-shot process with the conductors being molded from a conductive plastic or other material. Also, the conductors 130 may be formed by etching or laser treatment such as LDS, or other methods and manners that are known in the art. It is preferred that the conductors 130 be formed as part of the housing by using conductive plating or plastic so as to obtain the benefit of an overall reduced height and cost for the plug connector 100.

Figure 9A:
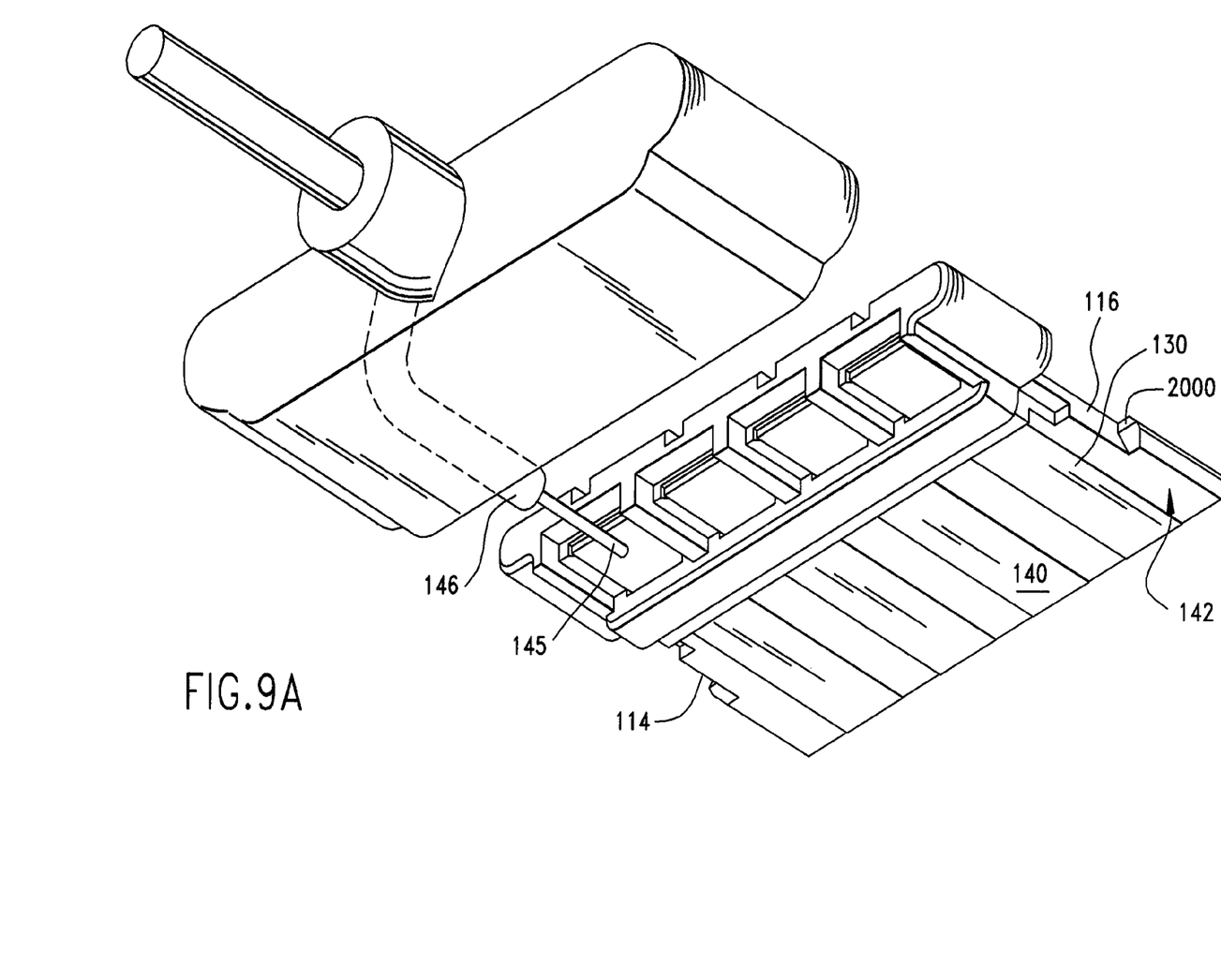
FIG. 9A is a perspective view of the I/O connector of FIG. 1, taken from the bottom and with the connector body removed from its housing for clarity.
Figure 9B:
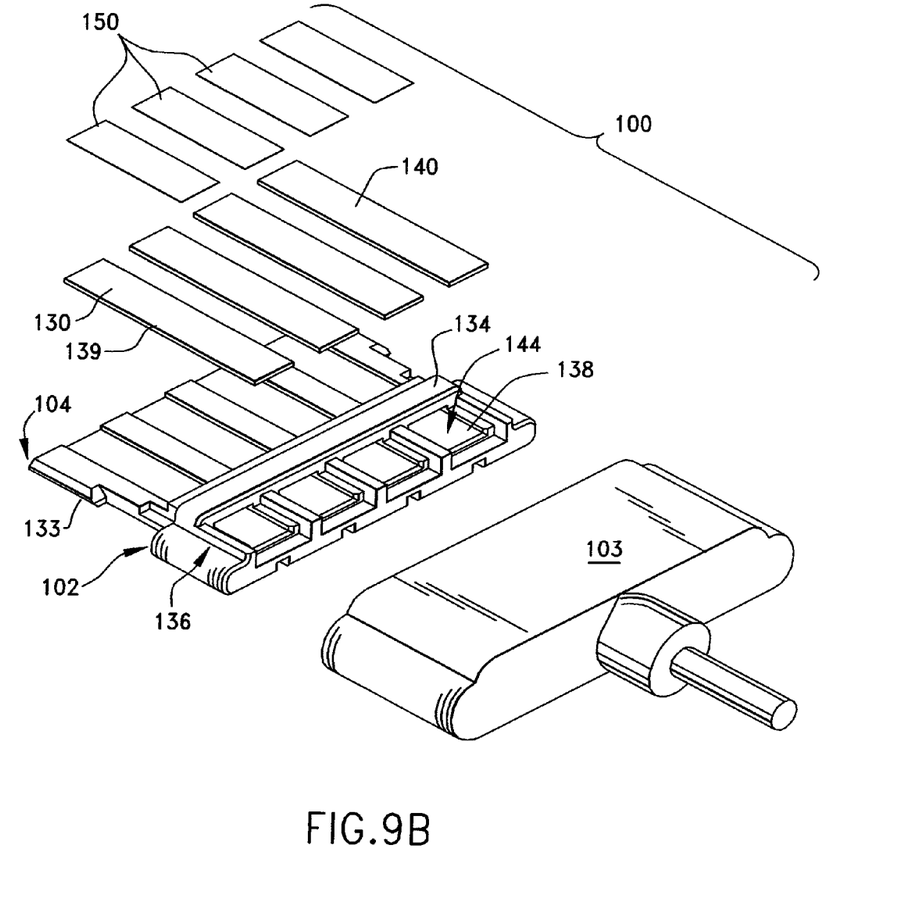
FIG. 9B is the same view as FIG. 9A, but in an exploded format and with the direction of the I/O connector reversed.

FIG. 9B is an exploded view of the plug connector 100, taken from the underside thereof to better illustrate the mating and terminating faces thereof. As shown, the connector housing 102 may include a wall 134 that serves to define a barrier between the mating blade 108 (or mating face 133) and the terminating face 136 of the plug connector 100. A series of channels, or slots 138, are shown extending lengthwise between the ends of the connector housing 102 and extending between the mating and terminating faces 133,136. Each channel 138 receives an elongated conductive 139 member that defines a single conductor 130. As stated above, the conductive members 139 may be metal terminals or conductive plastic, or they may represent an extent of conductive material molded in place within the connector housing 102.

On the terminating face 133, or mating blade 108, the exposed exterior surfaces 140 of the conductors 130 preferably lie flush with the bottom surface 142 of the mating blade 108 so that the mating blade will lie in reliable contact against the upper surface of the circuit board 153. On the terminating face portion 136 of the connector housing 102, the exposed exterior surfaces 140 of the conductors 130 are recessed to form a terminating channel, or nest 144, into which the exposed conductors 145 of cable wires 146 may be held. The exposed conductors 145 are preferably attached to the connector housing conductors by way of soldering or the like (FIG. 9A).

In an important aspect of the Present Invention, the plug connector 100 utilizes a capacitively coupled mating interface, rather than a traditional metal to metal (galvanic) mating interface. As best shown in FIG. 9B, a thin dielectric film, or layer 150, is applied to the exposed surfaces of the plug connector conductors 130. This film, or layer 150, provides a non-galvanic signal transmission medium that is interposed between the plug connector conductors 130 and the contacts arranged on the surface of the circuit board 153. Typically, a film will be used and the dielectric may utilize a plastic, engineered or otherwise, on the order of about 0.015 millimeters thick while in a layer form, the dielectric member may be in the form of a coating that is formed by printing, dipping, painting, sputtering or any other suitable manner. Preferable materials have a high dielectric constant of 200 or more and preferably 300 although suitable results have been obtained where the dielectric constant of the entire system has been as low as about 45.

The target dielectric constant for connectors of the Present Invention is 300 and this may be achieved either by using a dielectric barrier with a dielectric constant of 300 and ensuring that there is a sufficiently large contact force applied to the conductors and the dielectric barrier (layer) to press the mating blade dielectric barrier portions into intimate contact with the circuit board contact pads so that there is hardly any air gap remaining between the dielectric barriers and the contact pads 152 of the circuit board 153 when the plug connector is fully inserted into the shell member 200. It has been found that the force required to obtain such intimate contact is much less that that required to effect a normal galvanic connection. For example, it has been discovered that as little as 8.1 grams of force can provide capacitively coupled connectors of the Present Invention with a capacitance of 11.0 picofarads while a comparable galvanic connector would require 30 grams of force for effective contact. The contact force is an important consideration for it is desirable to eliminate any air gap between the dielectric and the opposing conductor that it is pressed against, for the sir gap affects the effective dielectric constant of the two conductors and any interposed dielectric, as well as the capacitance for the assembly.

The dielectric constant will also affect the overall height of the connector assembly in which a dielectric interposer is used. When a dielectric interposer with a dielectric constant of 200 was used, electrical signal transfer was accomplished using a contact with dimensions of about 1.5 millimeters by about 4.0 millimeters with a resulting thickness, or height, taken through the contact and dielectric material of about 0.2 millimeters. However, when a material with a dielectric constant of 300 was used, the contact size could be reduced down to about 0.2 millimeters by about 1.5 millimeters and the thickness was reduced down to about 0.015 millimeters.

It has been found that metallic oxides provide a useful dielectric constant and the oxides may be applied to the conductors 130 by way on individual application or enhanced oxidation. Two such oxides that give desirable results are titanium and copper oxide with other oxides being suitable, such as aluminum, chromium and nickel oxides. Ceramic materials may also be used and are suitable for coating application of application by way of thin sheets of ceramic. It is preferred that the thickness of the dielectric barrier 140 is less than the thickness of the plug connector conductors 130 and thicknesses of the dielectric barrier range from between about 20,000 nanometers (0.2 millimeters) and 300 nanometers (0.0003 millimeters) thick. Such dielectrics are best applied in a coating manner, such as by sputtering.

The dimensions of the dielectric members are preferably the same as the plug connector conductors or the circuit board contact pads 152. In this regard, it is desired that the width and length of the plug connector conductors be the same or slightly larger than the circuit board contacts. Typically, the plug connector conductors should not be greater than 110% of the dimensions and size of the circuit board contact pads 152.

The plug connectors 100 of the Present Invention are preferably used in conjunction with an exterior guide, or shell member, 200 that is formed from a conductive material such as a sheet metal, or a conductive material such as a plastic plated with either with a conductive layer or otherwise rendered conductive such as by entrainment of conductive particles therein, or the exterior may include one or more conductive layers that are molded in place within the member. The term shell is used herein to describe a member that serves to guide and hold the plug connector in place, rather than provide an exterior covering for the plug connector as shell might be interpreted. Accordingly, as used in this detailed description, the terms "shell" and "guide" are intended to be synonymous.

The shell member 200 has a plurality of walls that cooperatively define its shape. These include a top wall 201, two side walls 202, 203, a rear wall 204 and a front extension wall 205 that extends from the two side walls 202, 203 underneath the top wall 201, and along the front edge 154 of the circuit board 152 to define an entrance, or passage 207 at the front end 206 of the shell member 200. The mating blade 108 of the plug connector 100 is received within this opening 207 and the plug connector mating blade 108 preferably extends all the way into the shell member 200 close to or in contact with the shell member rear wall 204. In this mating position, the mating blade conductors 130 and the dielectric barriers 140 disposed thereupon will lie above and in opposition to the circuit board contact pads 152. In order to mount the shell member 200 to the circuit board 153, the shell member 200 may include one or more mounting legs, in the form of flanges or tabs 210 that extend outwardly from the side walls 202, 203 thereof. These tabs 210 may be attached to like ground or attachment pads 212 on the circuit board by way of soldering or the like. The mounting flanges 210 may be positioned elsewhere on the shell member 200. The mounting flanges 210 may be formed by way of slots 211 in the sidewalls 202, 203 that serve to define the dimensions of the mounting flanges 210 and facilitate their bending in the outwardly direction.

Figure 10:
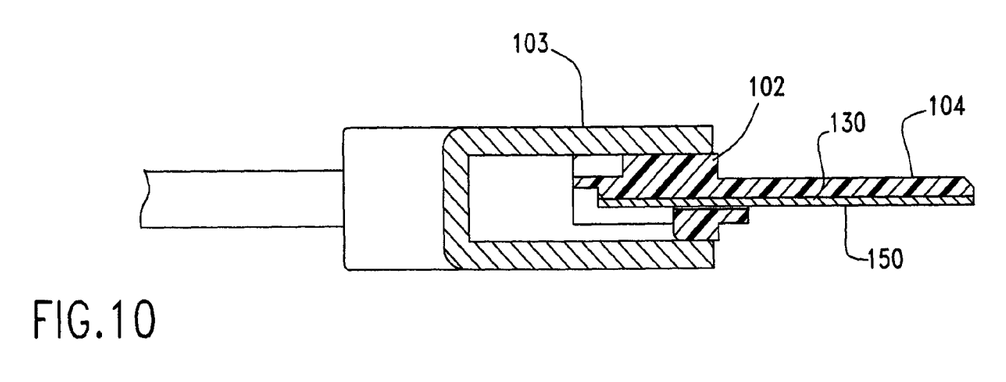
FIG. 10 is a cross-section of the I/O connector of FIG. 1, taken along Lines 10-10 thereof.
Figure 11:
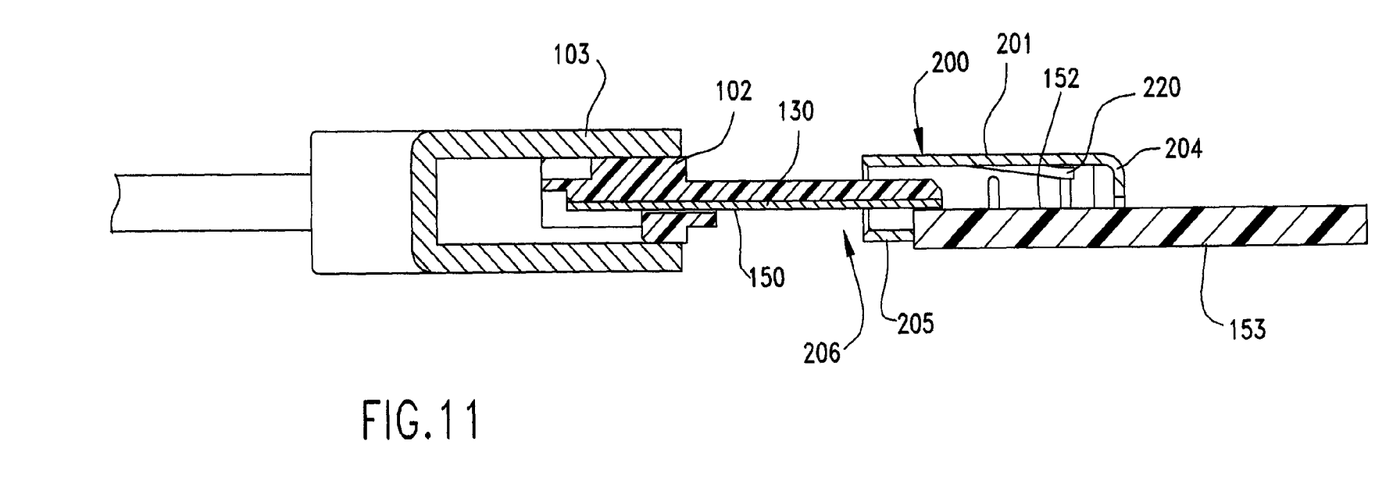
FIG. 11 is a cross-sectional view of the I/O connector of FIG. 1 in alignment with and partly inserted into a guide mounted on a circuit board.
Figure 12:
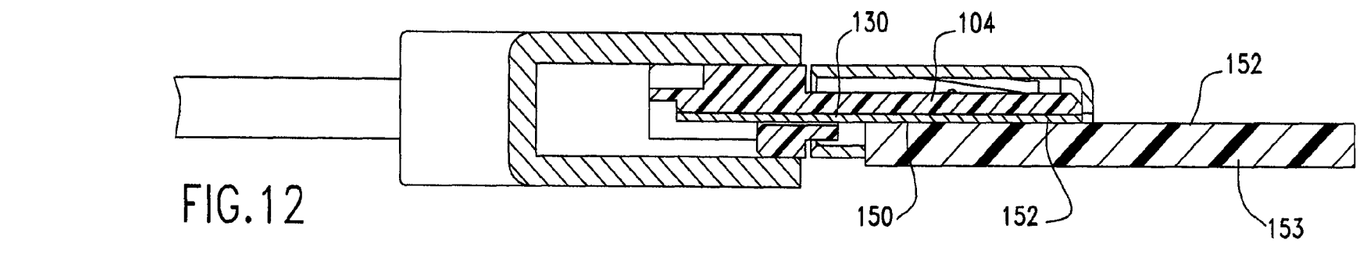
FIG. 12 is the same view as FIG. 11, but with the I/O connector fully mated with the contacts on the circuit board, such view being taken generally along Lines 12-12 of FIG. 7.

In order to effect the desired contact between the plug connector conductors 130, the dielectric barriers 140 applied thereto, and the circuit board contacts pads 153, the shell member 200 includes a means for exerting contact pressure onto the plug connector mating blade 104. In the drawings, this pressure exerting means is illustrated as a pair of press arms 220 that are disposed in the top wall 201 of the shell member 200. These press arms 220 extend at a downward angle into the hollow interior portion of the shell member 200. In instances where the shell member is formed from a sheet metal or similar materials the press arms may be stamped and then bent downwardly and in instances where the shell member is made from a non-metal, such as molded form a plastic or similar material, the press arms are molded in place at their downward angle. In this manner, the press arms 220, especially the free ends 221 thereof make contact with the top, pressure surface 110 of the mating blade 108 as it is inserted into the shell member 200. The sequence of insertion is shown best in the cross-sectional views of FIGS. 10-12. The press arms 220 extend in a cantilevered manner, lengthwise of the shell member 200 preferably with the free ends 221 extending in a direction rearwardly thereof and located nearer the shell member rear wall 204 than the front 206. Preferably, the shell member 200 is formed from an elastic material so the press arms 220 themselves will exhibit elastic properties and exert a desired pressure on the plug connector mating blade 108, yet return to their original position when the mating blade 108 is removed from inside of the shell member 200.

Figure 13:
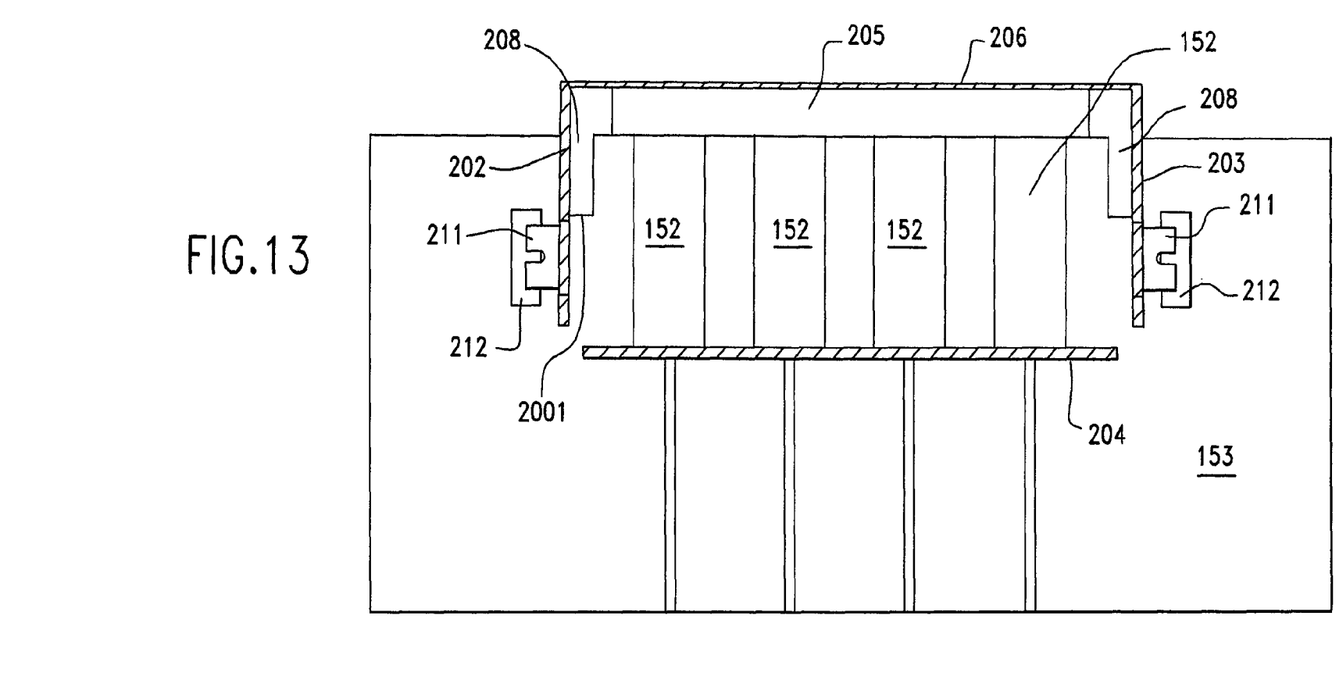
FIG. 13 is a cross-sectional view of the shell of FIG. 14, taken alone Lines A-A thereof and illustrating the plug connector engagement members.

In order to assist in properly positioning the plug connector conductors 130 in alignment with the circuit board contacts 152, the shell member 200 preferably includes a means for orienting the conductors, and as shown in FIGS. 13-5, these means may include a pair of engagement or positioning flanges 208 that are turned inwardly along the bottom of the two side walls 202, 203 so that they extend into the hollow interior space of the shell member 200. These engagement flanges 208 lie flush with the top surface of the circuit board 153 and the plug connector 100 is provided with a pair of engagement recesses, or notches 114, 116 that are disposed on the plug connector mating blade 108 adjacent the connector housing 102. As shown best in FIG. 14B, these notches 114, 116 may be considered as defining wings 120, 122 at the forward side ends of the mating blade 108. The notches 114, 116 of the mating blade are forced down onto the circuit board in a manner such that they abut the shell member engagement flanges 208, specifically the mating blade trailing edges 2000 abut the trailing edges 2002 of the engagement flanges 208. Likewise, the mating blade wing portions 120, 122 are received in the space between the front edge of the engagement flanges 208 and the shell member rear wall 204.

Figure 14:
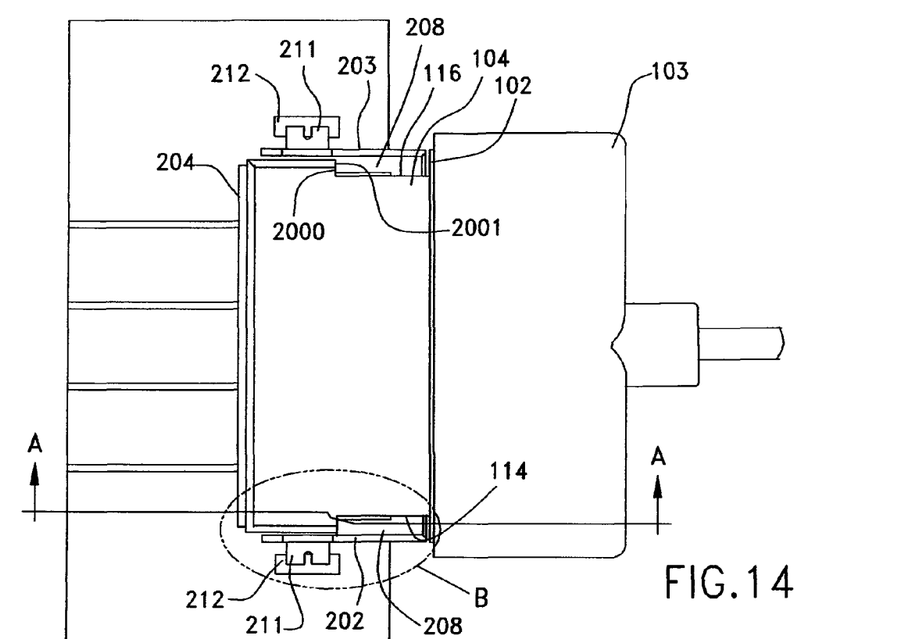
FIG. 14 is the same view as FIG. 13, but with the plug connector of FIG. 1 inserted into the shell.
Figure 14A:
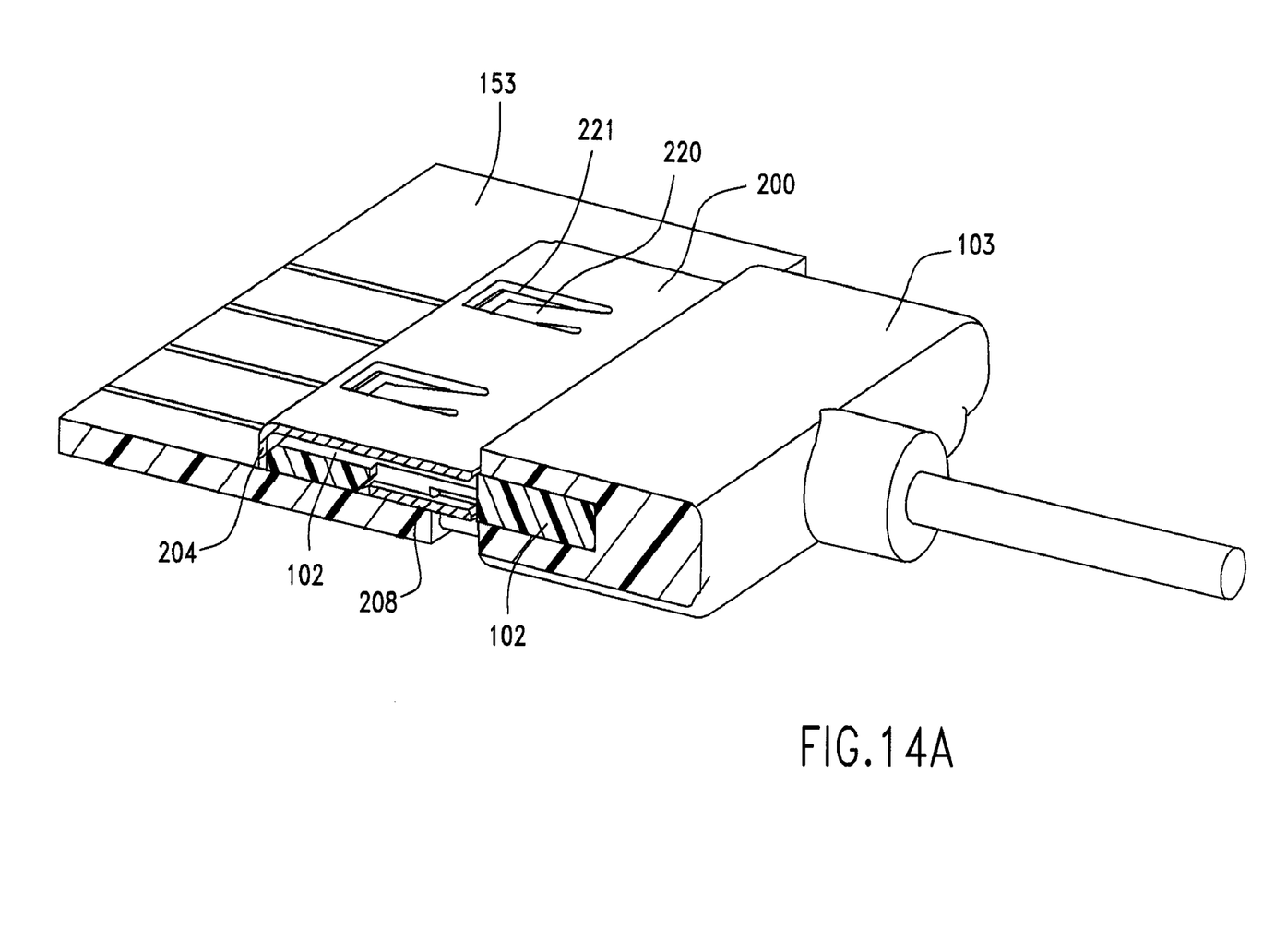
FIG. 14A is a cross-sectional view of FIG. 14 taken along Lines A-A thereof and illustrating the interaction between the plug connector wing members and the guide shell.
Figure 14B:
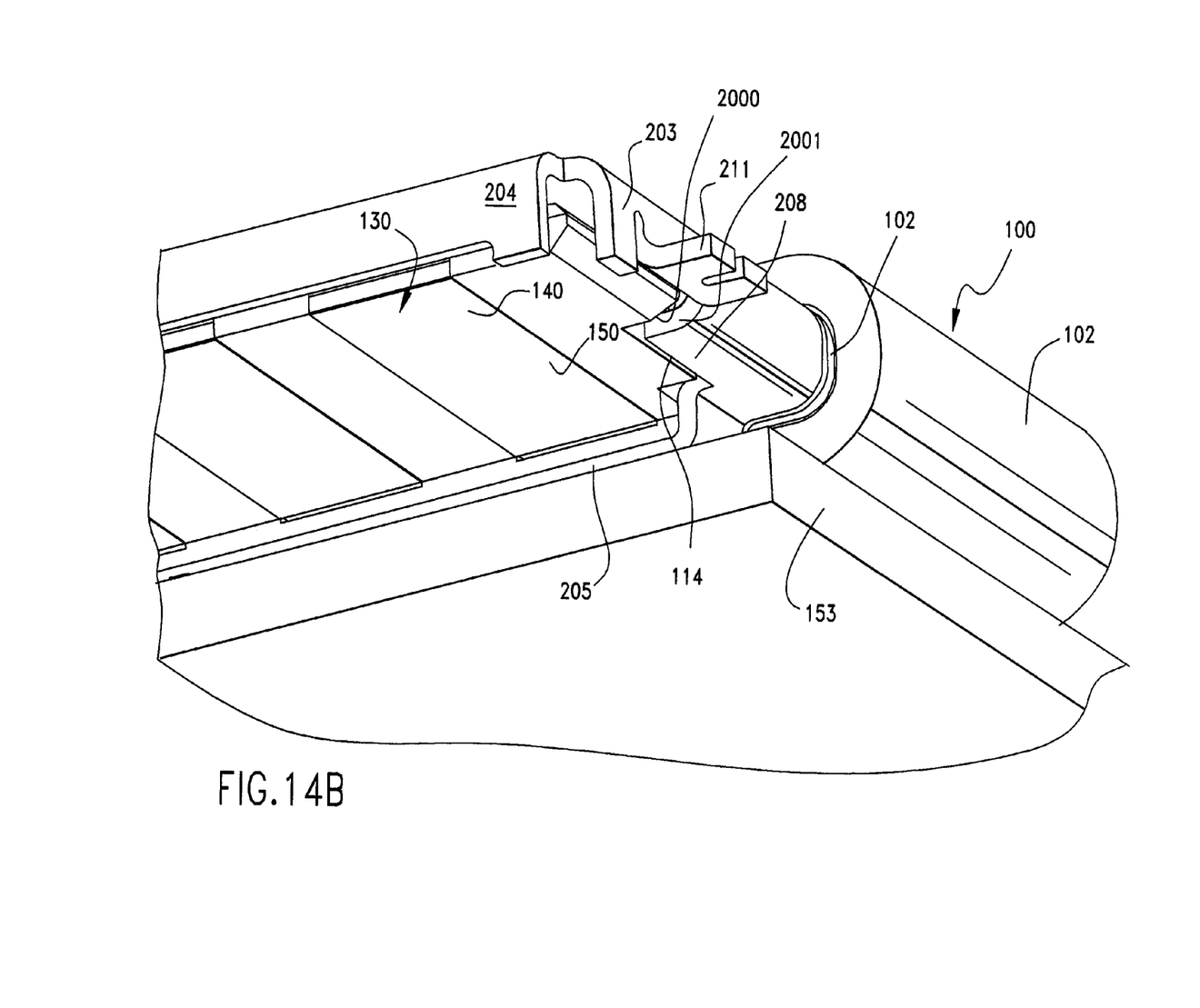
FIG. 14B is an enlarged detail view of FIG. 14, taken from the bottom with the circuit board removed, and illustrating the plug connector inserted into the guide shell.
Figure 15:
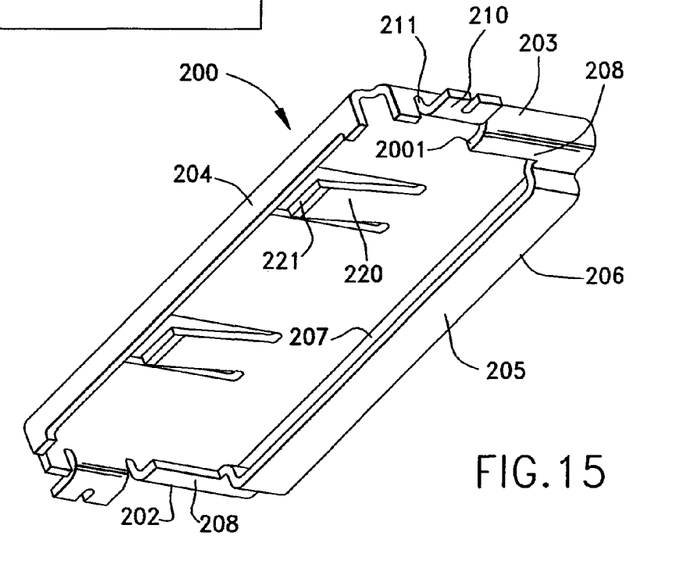
FIG. 15 is a perspective view of the shell member of FIG. 6, taken from underneath showing the press arms, mounting tabs and positioning flanges.

As shown in FIG. 14, the engagement flanges 208 serve to limit the forward and sideward movement of the mating blade 108 when it is fully inserted into the shell member 300. The engagement flanges 208 and the press arms 220 then cooperate to retain the plug connector 100 in place within the shell member 200, with the press arms forcing the mating blade conductors 130 and their dielectric barriers 140 down into contact with the circuit board contacts 152. The engagement flanges 208 likewise define a pair of slots within the shell member at the surface of the circuit board 163 into which the mating blade wing portions 120, 122 are received in a manner such that proper mating of the plug connector 100 with the shell member 200 is reliably effected. The engagement flanges 208, as shown in FIGS. 14 and 14B, serve to restrain the mating blade 108 from excessive forward and sideward movement. In this manner, the plug connector may be pushed in horizontally until its wing portions 120, 122 fall into the slots defined between the engagement flange 208 and the shell member near wall 204.

Figure 16:
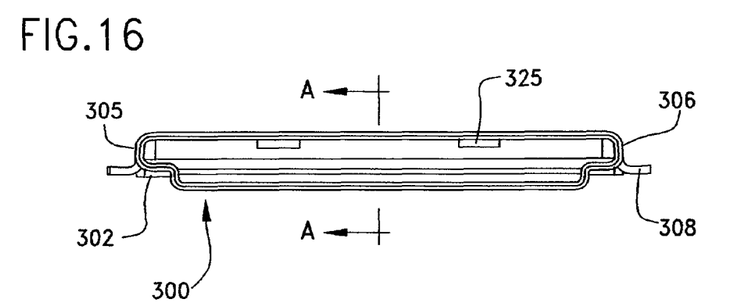
FIG. 16 is a front elevational view of another embodiment of a shell member used with the plug connectors of the Present Invention.
Figure 16A:
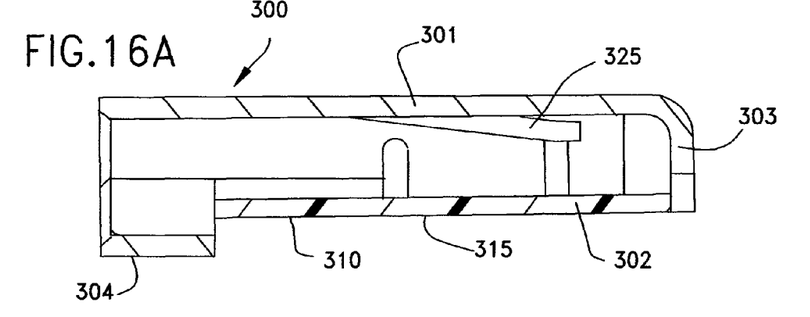
FIG. 16A is a cross-sectional view of FIG. 16, taken along Lines A-A thereof.
Figure 16B:
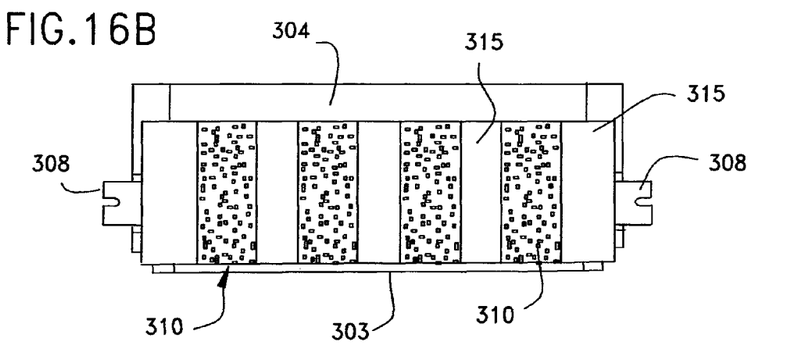
FIG. 16B is a bottom plan view of the shell member of FIG. 16.
Figure 16C:
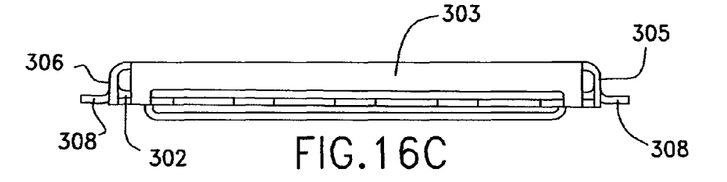
FIG. 16C is a rear elevational view of the shell member of FIG. 16.

FIGS. 16-16C illustrates another embodiment of a connector system constructed in accordance with the principles of the Present Invention. In this embodiment, the shell member 300 has a sets of contacts integrated with it. As shown in FIG. 16A, the shell member 300 includes a top wall 301, a bottom wall 302, a rear wall 303 and two side walls 305, 306 and a front rim wall 304, all of which cooperatively define a hollow interior space which receives the mating blade of a plug connector (not shown) as described for the other embodiments above. A pair of press arms 325 are formed in the top wall 301 and they extend downwardly into the interior space, and the shell member 300 also includes mounting flanges 308 for attaching it to a circuit board. However, in this embodiment, the bottom wall 302 may have conductive strips 310 applied to the bottom surface thereof as shown in FIG. 16B and these conductive strips may be spaced apart widthwise along the bottom wall 301 by intervening non-conductive, dielectric areas 315. This is accomplished in one instance by forming the shell member 300 out of an insulative, but high dielectric material, such as a plastic or resin and plating selected portions of the exterior with a conductive plating. These portions would include the top wall 301, rear wall 303, side walls 305, 306 and mounting flanges 308 so as to provide a conductive shield over the exterior surfaces of the shell member 300.

Similarly, the bottom wall 302 of the shell member 300 may be selectively plated to define the aforementioned conductive strips 310 and because the material of construction is a dielectric, the bottom wall 302 may serves as a dielectric interposer 315 between the plug connector conductors 130 and the contacts 152 on the circuit board 153. The conductive strips 310 on the bottom of the shell member 300 may be soldered or otherwise attached to the circuit board contacts. The inner surface (i.e., the top surface of the bottom wall 302) of the bottom wall 302 of the plug connector 100 may also be plated to define conductive surfaces, or contacts, therein to provide a galvanic connection between the plug connector (without any dielectric barriers thereon) and the inner contacts of the shell member, while relying upon the bottom wall of the shell member to provide the dielectric signal transmission medium for the connector assembly.

In another alternative construction, the contacts of the shell member may include conductive portions that extend completely through the bottom wall and the dielectric signal transmission barriers will include the dielectric barriers 140 applied to the plug connector conductors 130.

The benefits of the Present Invention are multiple. It has been found that the heights of such I/O connectors can be reduced down to 1.55 millimeters and at least 1.0 millimeters is possible, which represents a significant reduction in height over prior known I/O connectors for similar applications of 3.0 millimeters and higher. The use of high dielectric constant materials as the interposed barriers results in reduced sizes being required for the contacts. Additionally, because the conductors 130 are formed on the bottom mating surface of the plug connector mating blade 108 and are preferably applied as a coating or layer, the use of a contact beam as found on conventional metal terminals is eliminated and along with it the concern of having a sufficient contact force. The only force that need be exerted with connectors of the Present Invention is a pressure force from the press arms of the shell members, leading to more simplified mechanical construction, which results in a reduction in the time and cost of manufacturing connectors of the Present Invention.

While a preferred embodiment of the Present Invention is shown and described, it is envisioned that those skilled in the art may devise various modifications without departing from the spirit and scope of the foregoing Description and the appended Claims.

What is claimed is:

1. A connector assembly for providing a capacitively coupled connection between a plurality of wires and a plurality of planar contact disposed on a circuit board, comprising:
a hollow shell for mounting to the circuit board, the shell including a plurality of walls, including at least two opposing side walls and a top wall interconnecting the two sidewalls together, the walls cooperatively defining a hollow interior receptacle that encloses the circuit board contacts and which receives a portion of an opposing mating connector;
a plug connector insertable into said shell, the plug connector including an insulative housing, a mating blade extending outwardly from the housing, the mating blade including a mating surface and an opposing pressure surface, the mating surface including a plurality of conductive planar contact surfaces disposed thereon and spaced apart from each other widthwise of said mating surface, the mating blade contact surfaces being dimensioned so as to lie in one-to-one opposition to said circuit board contacts when said plug connector is fully inserted into said shell, said plug connector further including a dielectric barrier disposed on each of said mating blade contact surfaces so as to prevent galvanic contact between said plug connector contact surfaces and said circuit board contact pads when said plug connector is fully inserted into said shell, the dielectric barriers cooperatively providing a dielectric interface that permits capacitive coupling between said mating blade contact surfaces and said circuit board contact pads when said plug connector is fully inserted into said shell;
wherein said shell further including means for exerting pressure on said mating blade pressure surface to force said mating blade dielectric barriers into contact with said circuit board contact pads.

2. The connector assembly of claim 1, wherein said pressure exerting means includes at least one press arm formed integrally with said shell top wall.

3. The connector assembly of claim 1, further including at least a pair of conductive surfaces disposed on said mating blade mating surface and said pressure exerting means includes at least two press arms that extend the interior receptacle and into contact with said mating blade pressure surface, the pair of conductive surfaces being spaced apart from each other widthwise along said mating surface.

4. The connector assembly of claim 1, wherein said shell includes a pair of mounting flanges extending from said side walls, the mounting flanges being arranged to mate with mounting surfaces on said circuit board.

5. The connector assembly of claim 3, wherein said press arms are spaced apart from each other widthwise along said shell top wall.

6. The connector assembly of claim 5, wherein said shell is formed of a conductive material.

7. The connector assembly of claim 1, wherein said shell includes a pair of engagement flanges extending inwardly from said two side walls, the engagement flanges engaging said plug connector mating blade when said plug connector is fully inserted into said shell.

8. The connector assembly of claim 7, wherein said plug connector mating blades includes a pair of notches disposed on two opposing sides thereof, the notches receiving said engagement flanges when said plug connector is fully inserted into said shell.

9. The connector assembly of claim 8, wherein said notches are disposed on said mating blade adjacent said housing.

10. The connector assembly of claim 1, wherein said dielectric barrier has a dielectric constant of at least 300.

11. The connector assembly of claim 1, wherein said dielectric barrier has a thickness which is less than a corresponding thickness of said conductive surface onto which said dielectric barrier is applied.

12. The connector assembly of claim 11, wherein said dielectric barrier has a thickness than is between about 0.0003 millimeters to 0.2 millimeters thick.

13. The connector assembly of claim 1, wherein said shell member has a height of about 1.60 millimeters or less.

14. A male connector for establishing an electrical connection between a plurality of wires and a plurality of contacts by way of a capacitively coupled mating interface, comprising: an insulative connector housing, the connector housing including an elongated mating blade extending from said connector housing, the mating blade including two opposing faces, one of the two faces defining a contact face and the other of said two surfaces defining a pressure face upon which a pressure force may be exerted, the contact face including a plurality of planar, conductive surfaces extending in a lengthwise direction along said contact face, the conductive surfaces being spaced apart from each other in a widthwise direction upon said contact face, the connector further including a dielectric barrier disposed on said conductive faces which provides a non-conductive member interposed between said conductive surfaces an opposing conductive surfaces of a mating connector or circuit board; said connector housing further including a plurality of termination nests for receiving a conductor of an electrical wire, each termination nest being connected one of said conductive surfaces.

15. The connector of claim 14, wherein said conductive surfaces are plated on said mating blade and said dielectric barriers have a thickness that does not exceed 20,000 nanometers.

16. The connector of claim 14, wherein said connector housing includes a pair of wing portions extending widthwise from said mating blade, the wing portions defining the respective notches on opposite sides of said shell member.

17. A connector assembly for providing a capacitively coupled connection between a plurality of wires and a plurality of planar contact disposed on a circuit board, the connector assembly, comprising: a hollow shell for mounting to the circuit board, the shell including a plurality of walls, including at least two opposing side walls and a top wall interconnecting the two sidewalls together, a bottom wall also interconnecting said two side walls together, the walls all cooperatively defining a hollow interior receptacle for mounting to the circuit board contacts and which receives a portion of an opposing mating connector; a plug connector insertable into said shell, the plug connector including an insulative housing, a mating blade extending outwardly from the housing, the mating blade including a mating surface and an opposing pressure surface, the mating surface including a plurality of conductive planar contact surfaces disposed thereon and spaced apart from each other widthwise of said mating surface, the mating blade contact surfaces being dimensioned so as to lie in one-to-one opposition to said circuit board contacts when said plug connector is fully inserted into said shell, said plug connector further including a dielectric barrier disposed on each of said mating blade contact surfaces so as to prevent galvanic contact between said plug connector contact surfaces and said circuit board contact pads when said plug connector is fully inserted into said shell, the dielectric barriers cooperatively providing a dielectric interface that permits capacitive coupling between said mating blade contact surfaces and said circuit board contact pads when said plug connector is fully inserted into said shell; and, said shell bottom wall including top and bottom surfaces, said bottom wall being formed from a non-conductive, dielectric material, the shell member bottom wall top surface including a plurality of conductive surfaces disposed thereon and the shell member bottom wall bottom surface including a plurality of conductive surfaces disposed thereon and in alignment with said shell member bottom wall top surface conductive surfaces so as to transfer electrical signals received from said plug connector through said shell member bottom wall between said shell member bottom wall top and bottom conductive surfaces by way of capacitively coupling.

18. The connector assembly of claim 17, wherein said shell member further includes means for exerting pressure on said mating blade to force said mating blade dielectric barriers into contact with said circuit board contact pads.

* * * * *